(12) United States Patent
Peterson et al.

(10) Patent No.: US 8,599,557 B2
(45) Date of Patent: Dec. 3, 2013

(54) PRINTED CIRCUIT BOARD COOLING ASSEMBLY

(75) Inventors: Eric C. Peterson, McKinney, TX (US); Brandon Rubenstein, Loveland, CO (US); Vic Hong Chia, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 214 days.

(21) Appl. No.: 13/258,521

(22) PCT Filed: Apr. 29, 2009

(86) PCT No.: PCT/US2009/042086
§ 371 (c)(1),
(2), (4) Date: Sep. 22, 2011

(87) PCT Pub. No.: WO2010/126499
PCT Pub. Date: Nov. 4, 2010

(65) Prior Publication Data
US 2012/0020022 A1    Jan. 26, 2012

(51) Int. Cl.
*H05K 7/20* (2006.01)

(52) U.S. Cl.
USPC .......... 361/699; 361/679.52; 361/679.53; 361/698; 361/700; 361/719; 165/80.4; 165/80.5; 165/104.21; 165/104.26; 165/104.33

(58) Field of Classification Search
USPC .......... 361/679.46, 679.52, 679.53, 698, 699, 361/700, 702, 719; 165/80.2, 80.4, 80.5, 165/104.33, 104.34, 104.21, 104.26, 185; 174/15.1, 15.2, 16.3; 62/259.2; 257/714, 715
See application file for complete search history.

(56) References Cited

U.S. PATENT DOCUMENTS

| 4,315,300 | A | 2/1982 | Parmerlee et al. | |
| 7,151,668 | B1 * | 12/2006 | Stathakis | 361/700 |
| 7,286,355 | B2 * | 10/2007 | Cheon | 361/699 |
| 7,641,101 | B2 * | 1/2010 | Campbell et al. | 228/183 |
| 7,855,888 | B2 * | 12/2010 | Peterson | 361/699 |
| 7,965,509 | B2 * | 6/2011 | Campbell et al. | 361/699 |
| 7,969,736 | B1 * | 6/2011 | Iyengar et al. | 361/699 |
| 8,027,162 | B2 * | 9/2011 | Campbell et al. | 361/699 |

(Continued)

FOREIGN PATENT DOCUMENTS

| CN | 101076241 | 11/2007 |
| EP | 0281404 | 9/1988 |
| JP | 08172286 | 7/1996 |

OTHER PUBLICATIONS

International Searching Authority, International Search Report and The Written Opinion, 13 pages, Jan. 2010.

*Primary Examiner* — Michail V Datskovskiy
(74) *Attorney, Agent, or Firm* — Steven L. Webb

(57) ABSTRACT

A cooling apparatus for a printed circuit board assembly is disclosed. The cooling apparatus comprises a main printed circuit (PC) board 202. The main PC board 202 has a plurality of connectors 210 mounted, in a parallel row, onto the top side of the main PC board 202. A first liquid cooling manifold 204 is positioned along one end of the parallel row of connectors 210 and a second liquid cooling manifold 206 is positioned along the other end of the parallel row of connectors 210. A plurality of heat sink devices 208, each having an elongated shape, run parallel to, and on each side of, the plurality of connectors 210. The plurality of heat sink devices 208 are coupled to the first and second liquid cooling manifolds.

12 Claims, 3 Drawing Sheets

(56) References Cited

U.S. PATENT DOCUMENTS

| | | | |
|---|---|---|---|
| 8,081,473 B2 * | 12/2011 | Cipolla et al. | 361/719 |
| 8,363,412 B2 * | 1/2013 | Budai | 361/720 |
| 8,385,067 B2 * | 2/2013 | Arvelo et al. | 361/699 |
| 2006/0056154 A1 | 3/2006 | Foster et al. | |
| 2006/0098409 A1 * | 5/2006 | Cheon | 361/699 |
| 2008/0273307 A1 * | 11/2008 | Campbell et al. | 361/699 |

* cited by examiner

PRINTED CIRCUIT BOARD COOLING ASSEMBLY

BACKGROUND

Computer data centers or computer servers generate large amounts of heat. Most data centers or servers currently use air to cool the computers or the components in the computer systems. Because of the increasing density of the components in the computer systems, the heat density of the computer systems and data centers is increasing.

The increase in heat density requires either higher air flow rates, cooler air, or both to adequately cool the system components. Cooling air to a temperature below the ambient temperature requires a refrigeration system. Refrigeration systems typically use large amounts of power. In fact, the refrigeration systems for a data center may use more than 50% of the total power required by the data center.

Some data centers use liquids as the heat transfer medium instead of, or in addition to, air. Liquids typically have a much higher heat carrying capacity than air. Unfortunately using liquids as the heat transfer medium can make it difficult to modify or replace components in the computer systems because the coolant lines may need to be opened and then re-sealed.

DETAILED DESCRIPTION

FIGS. 1-4 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
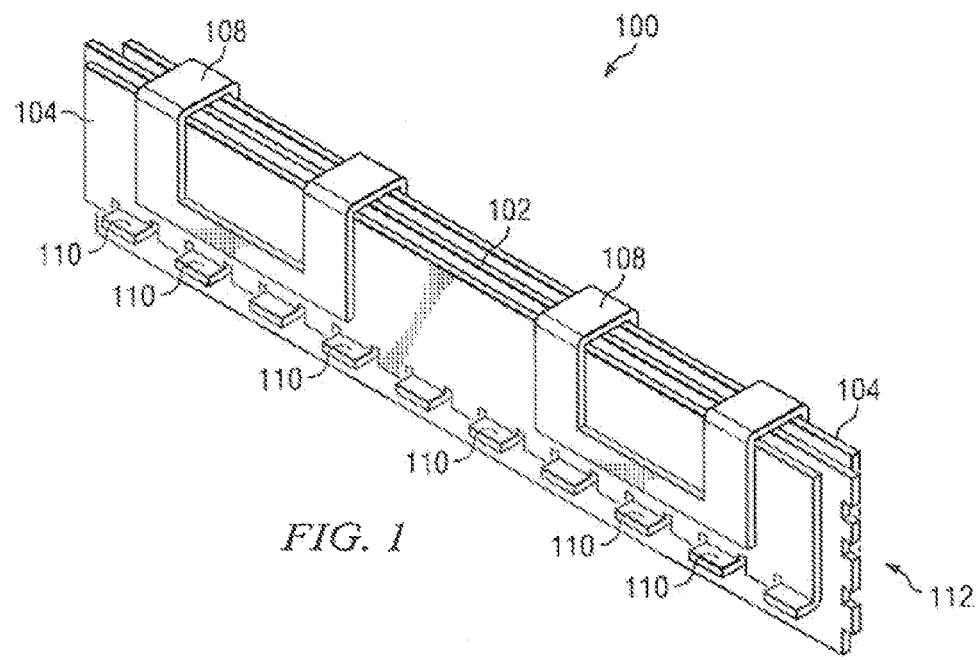
FIG. 1 is an isometric view of a component assembly 100 in an example embodiment of the invention.

FIG. 1 is an isometric view of a component assembly 100 in an example embodiment of the invention. Component assembly 100 comprises a component board 102, two heat spreaders 104, and two clips 108. Component board 102 may comprise a dual in-line memory module (DIMM), an application specific integrated circuit (ASIC) mounted to a PC board, or any other type of electronic component mounted to a PC board that requires cooling. Heat spreaders 104 may be a plate formed to contact the top surfaces of the components mounted onto component board 102. The two heat spreaders 104 may be mirror images of each other, may be the same part rotated 180 degrees with respect to each other or may have different shapes to match differently shaped components mounted on the two sides of component board 102.

In operation, the two heat spreaders 104 are held against the components mounted on the front and/or back face of component board 102 by clips 108. Clips are shown in this example embodiment, but any suitable method may be used to hold heat spreaders 104 in place. In another example embodiment of the invention, there may only be one heat spreader 104 in the component assembly.

A plurality of tabs 110 are formed along the bottom edge of heat spreaders 104. The tabs 110 are spaced apart along the bottom of the heat spreader with gaps that have a gap length that is slightly larger than the length of the tabs. At one end 112 of the component assembly 100, the end tab 110 on the heat spreader 104 on the left side of the component assembly 100 is at the very end of the heat spreader 102. The end tab 110 on the heat spreader on the other side of component assembly 100, is spaced away from the end of the heat spreader 104 by the gap length. This allows two component assemblies 100 to be placed next to each other with the tabs 110 from the two adjacent heat spreaders 104 fitting into the gaps of the other heat spreader 104.

A thermal interface material such as grease may be used to increase the thermal coupling between the components mounted onto the component board 102 and the heat spreaders 104. In another example embodiment of the invention, a heat spreading enhancement such as a vapor chamber can be added to the heat spreader to increase the thermal efficiency. The heat spreading enhancement may be located between the heat spreader and the thermal interface material, or may be in direct contact with the components mounted on the component board.

Figure 2:
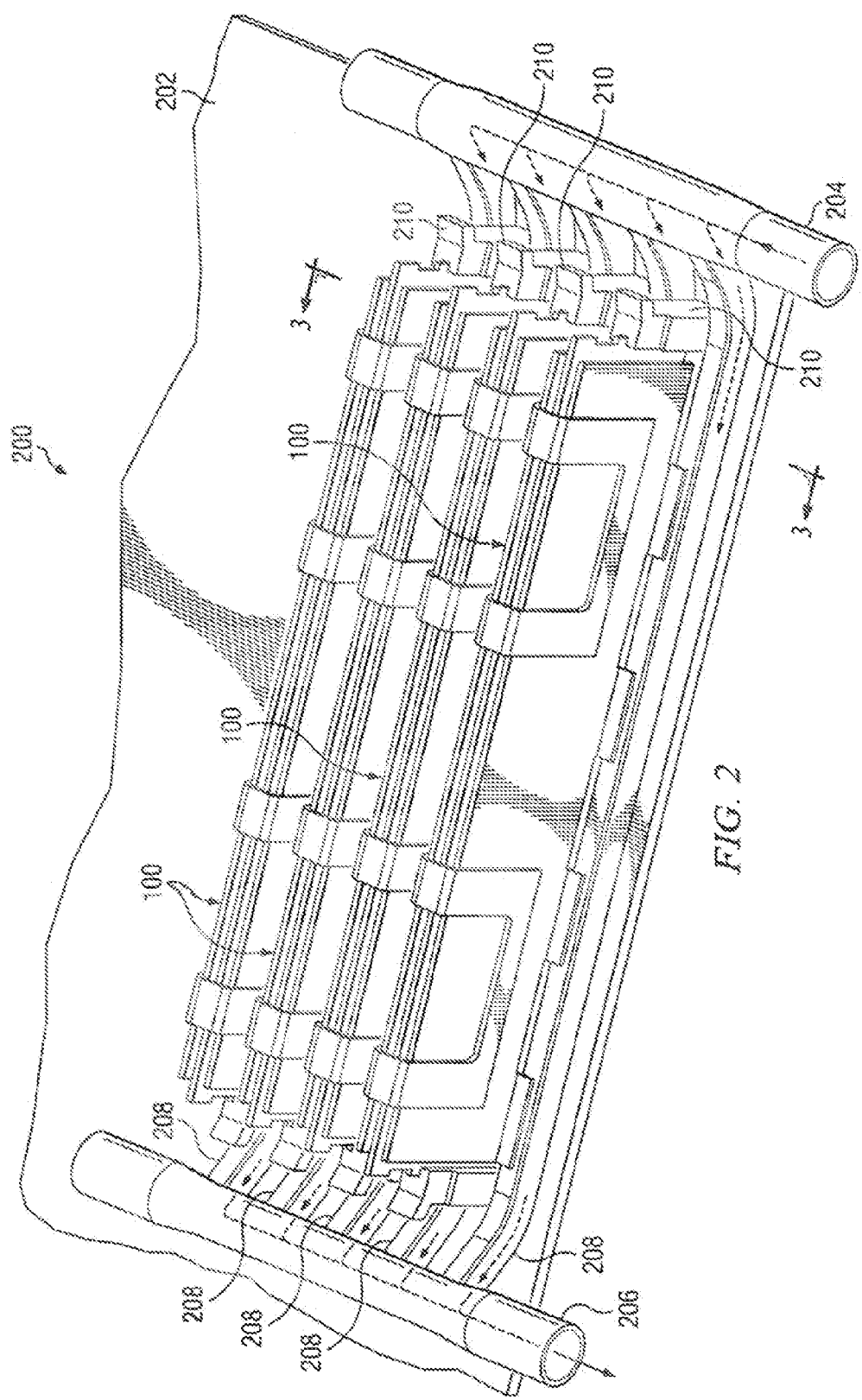
FIG. 2 is an isometric view of a PC board assembly 200 in an example embodiment of the invention.

FIG. 2 is an isometric view of a printed circuit (PC) board assembly 200 in an example embodiment of the invention. PC board assembly 200 comprises main PC board 202, liquid cooling inlet manifold 204, liquid cooling outlet manifold 206, a plurality of liquid channels 208, a plurality of connectors 210, and a plurality of component assemblies 100. The plurality of connectors 210 are mounted on the top side of main PC board 202 in a parallel row. Component assemblies 100 are removably inserted into the plurality of connectors 210 and make electrical contact with main PC board 202, through the plurality of connectors 210.

Liquid cooling inlet manifold 204 runs along one end of the row of connectors 210 and liquid cooling outlet manifold 206 runs along the other end of the row of connectors 210. The plurality of liquid channels 208 are coupled to the liquid cooling inlet manifold 204 and the liquid cooling outlet manifold 206. The plurality of liquid channels 208 run parallel to, and on each side of, the plurality of connectors 210. Each of the plurality of liquid channels 208 may also be know as a heat sink device.

In one example embodiment of the invention, liquid cooling inlet manifold 204 and liquid cooling outlet manifold 206 are mounted onto main PC board 202. In other example embodiments, liquid cooling inlet manifold 204 and liquid cooling outlet manifold 206 may be mounted adjacent to main PC board 202.

A cooling fluid supply line (not shown) is coupled to the liquid cooling inlet manifold 204. A cooling fluid return line (not shown) is coupled to the liquid cooling outlet manifold 206. In operation, fluid flows from liquid cooling inlet manifold 204, through the plurality of liquid channels 208, and then exits through liquid cooling outlet manifold 206. The flowing fluid removes heat from each of the plurality of liquid channels 208.

Figure 3:
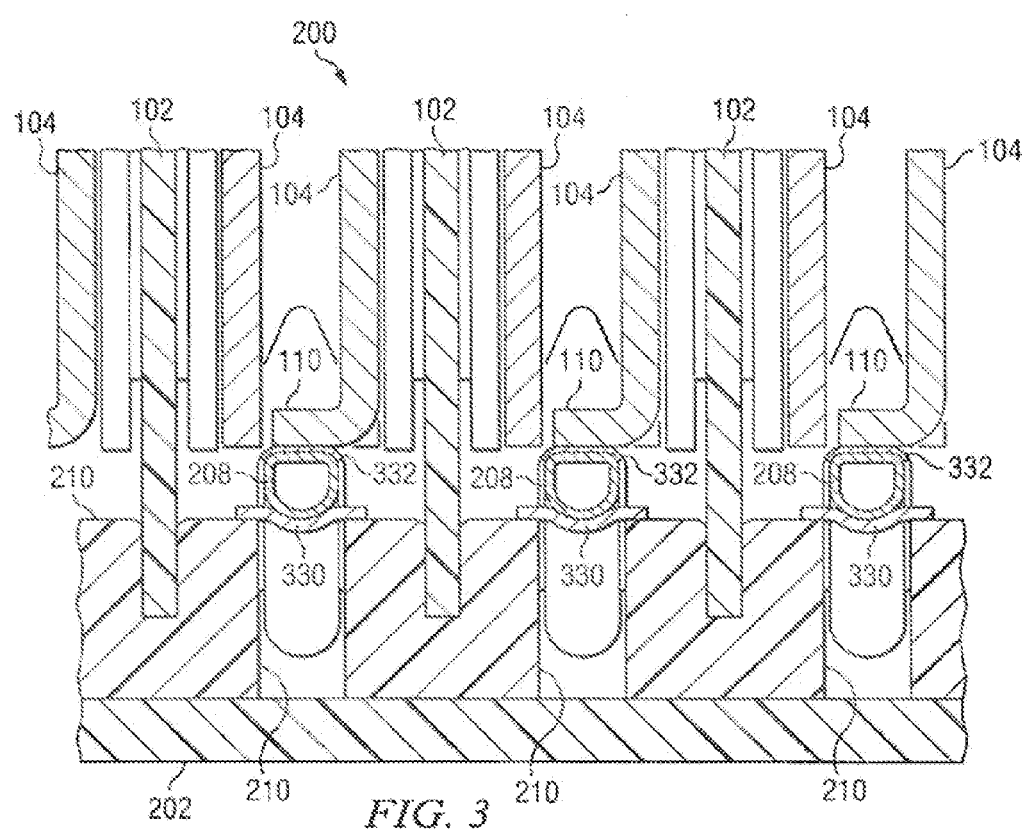
FIG. 3 is a partial sectional view AA of board assembly 200 in an example embodiment of the invention.

FIG. 3 is a partial sectional view AA of PC board assembly 200 in an example embodiment of the invention. FIG. 3 shows the plurality of connectors 210 mounted in a row along the top side of main PC board 202. The component board 102 from each of the plurality of component assemblies 100 is inserted into, and makes electrical contact with, one of the plurality of connectors 210. The plurality of liquid channels 208 are shown positioned between each of the plurality of connectors 210. In one example embodiment of the invention, the plurality of liquid channels 208 may be supported by a plurality of support brackets 330. In another embodiment of the invention, the plurality of liquid channels may be completely supported by the liquid cooling inlet and outlet manifolds. The tabs 110 from each of the plurality of heat spreaders 104 contacts the top sides of the plurality of liquid channels 208. In one example embodiment of the invention, a thermal material 332 may be placed between the tabs 110 and the top sides of the liquid channels 208.

Component assemblies 100 contact connectors 210 as the component assemblies 100 are inserted into connectors 210. Connectors 210 allow a range of travel to component assemblies 100 as the component assemblies 100 are inserted into connectors 210. Tabs 110 on heat spreaders 104 will bottom out against the liquid channels 208 before component assemblies 100 will bottom out against connectors 210, allowing good thermal contact between the tabs 110 and the liquid channels 208. In one example embodiment of the invention, clamps may be used to hold component assemblies into connectors 210 and against liquid channels 208.

In another example embodiment of the invention, tabs 110 may be replaced with a continuous flange that extends out from the heat spreader only one-half as far as the tabs 110. In this way, two flanges from component assemblies mounted in adjacent connectors would contact the same liquid channel with each flange contacting one-half of the top of the liquid channel.

Heat from the components mounted onto the component PC board 102, transfers into heat spreaders 104. The heat then flows from the tabs 110 on the heat spreaders 104 into the liquid channel 208. The fluid flowing through liquid channel 208 removes the heat from the liquid channel 208. The heat is then transferred through the cooling outlet manifold 206 into the cooling fluid return lines, and then out of the system. The cooling fluid supply lines and the cooling fluid return lines may be coupled to a heat exchanger, a refrigerator, a chiller, or the like. The cooling fluid may be conditioned to ambient temperature or to below ambient temperature.

Because each of the plurality of liquid channels 208 are positioned between the connectors 210, component assemblies 100 can be added or removed while the fluid cooling system remains sealed. This allows a close coupling between the fluid cooling system and the components to be cooled. The fluid cooling system also remains sealed when the PC board assembly 200 is not fully loaded (i.e. with some component assemblies 100 not present in the board assembly 200). In one example embodiment of the invention a failed component can be replaced or an additional component can be added without opening the sealed fluid cooling units. When a failed component is detected, if the component is not hot swappable, the board assembly 200 is powered down. The component assembly 100 containing the failed component is removed from the board assembly 200. A replacement component assembly 100 is inserted into the open location. During this process, the fluid cooling system remains sealed and may remain operational.

Figure 4:
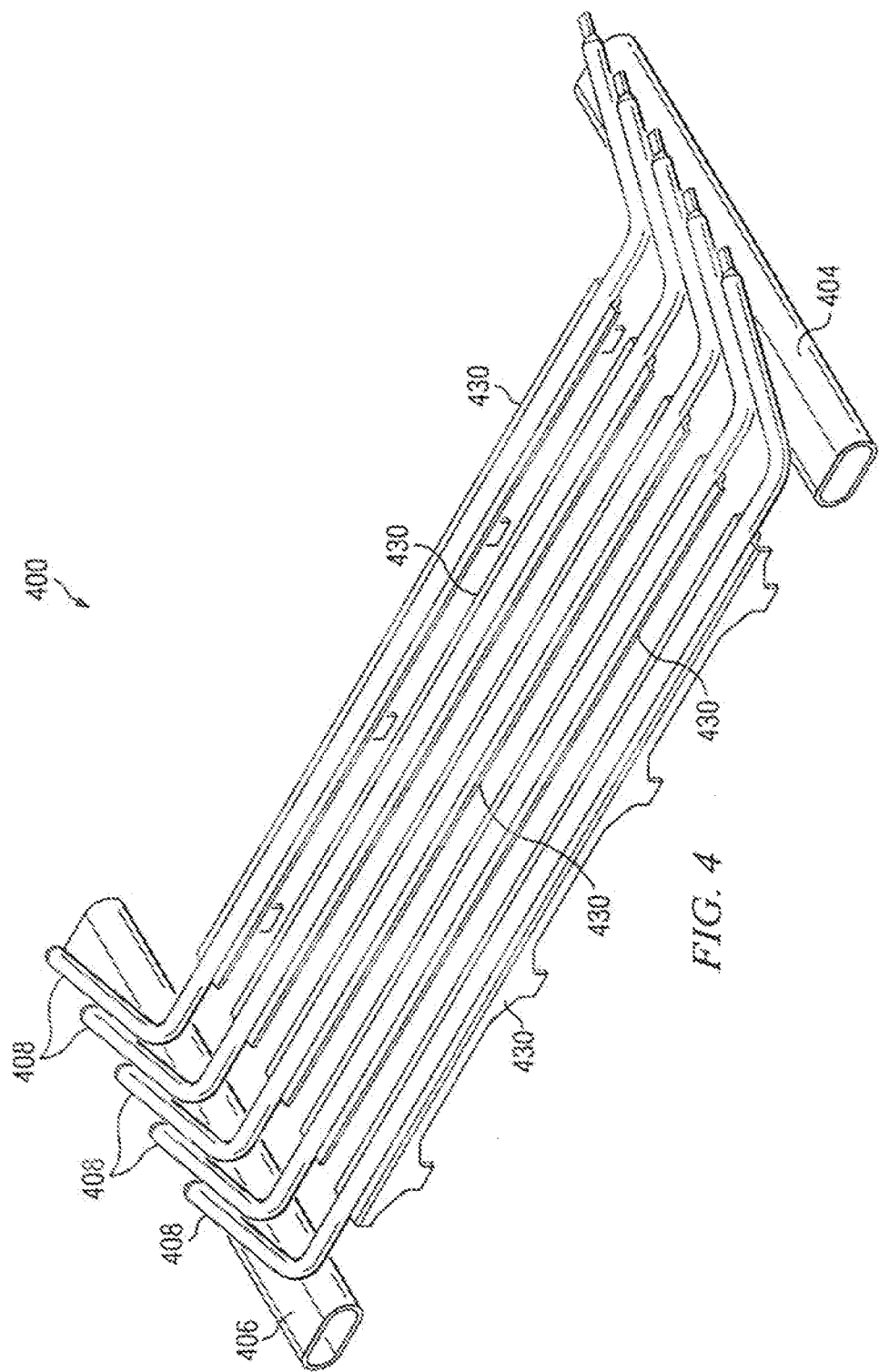
FIG. 4 is an isometric view of a cold frame in another example embodiment of the invention.

In another example embodiment of the invention, the plurality of liquid channels in the cold frame may be replaced with a plurality of heat pipes. FIG. 4 is an isometric view of a cold frame 400 in another example embodiment of the invention. Cold frame 400 comprises a first liquid cooling manifold 404, a second liquid cooling manifold 406, and a plurality of heat pipe assemblies 408. The plurality of heat pipe assemblies 408 may be supported by a plurality of support brackets 430. Each of the plurality of heat pipe assemblies 408 may be comprised of two individual heat pipes. The two individual heat pipes may have the hot ends coupled together in the middle of the heat pipe assemblies 408 and a cold end of each of the individual heat pipes at each end of the heat pipe assembly 408. This allows the two cold ends to be attached to the first and second liquid cooling manifold (404 and 406). The plurality of heat pipes may be permanently attached to the liquid cooling manifolds (404 and 406) using an appropriate material such as solder, swaging, or thermal epoxy. In operation, the plurality of heat pipe assemblies will be located parallel to, and on each side of, the connectors mounted on the main PC board 202. Each of the plurality of heat pipe assemblies 408 may also be know as a heat sink device.

What is claimed is:

1. A cooling apparatus, comprising:
    a main printed circuit (PC) board having a top side;
    a plurality of connectors mounted on the top side of the main PC board in a parallel row;
    a first liquid cooling manifold positioned along a first end of the parallel row of connectors;
    a second liquid cooling manifold positioned along a second end of the parallel tow of connectors;
    a plurality of heat sink devices, each having an elongated shape, running parallel to, and on each side of, the plurality of connectors, the plurality of heat sink devices each having a first end and a second end wherein the first end is coupled to the first liquid cooling manifold and the second end is coupled to the second liquid cooling manifold;
    at least one component assembly inserted into a first one of the plurality of connectors, wherein each component assenthlv comprises;
    a component PC board with at least one component mounted on a front face of the component PC board;
    a first heat spreader comprising a plate having a bottom side and a front face, where the front face is held against a top side of the at least one component mounted on the front face of the component PC board;
    a plurality of tabs spaced apart along the bottom side of the first heat spreader, such that the tabs contact a top side of one of the plurality of heat sink devices when the component PC board is inserted into one of the plurality of connectors.

2. The cooling apparatus of claim 1, wherein each of the plurality of heat sink devices comprise a liquid channel.

3. The cooling apparatus of claim 1, wherein each of the plurality of heat sink devices comprise a heat pipe assembly.

4. The cooling apparatus of claim 1, wherein at least one clip is used to mount the first heat spreader against the at least one component.

5. The cooling apparatus of claim 1, further comprising;
    a second heat spreader mounted against the component PC board on the opposite side from the first heat spreader, the second heat spreader comprising a plate having a bottom side and a front face;
    a plurality of tabs formed along the bottom side of the second heat spreader wherein the tabs are spaced apart with gaps that have a gap length that is slightly larger than a length of the tabs, and where the tabs on the second heat spreader are offset from the tabs on the first heat spreader such that the tabs on the second heat spreader fit between tabs on a first heat spreader of a second component assembly when the second component assembly is inserted into a second one of the plurality of connector that is adjacent to the first one of the plurality of connectors such that the first heat spreader of the second component assembly and the second heat spreader both contact a top side of one of the plurality of heat sink devices.

6. The cooling apparatus of claim 1, wherein a heat spreading enhancement is placed between the front face of the first heat spreader and the top side of the at least one component.

7. The cooling apparatus of claim 1, wherein a thermal interface material is placed between the front face of the first heat spreader and the top side of the at least one component.

8. The cooling apparatus of claim 1, wherein the first and second liquid cooling manifolds are mounted to the main PC board.

9. The apparatus of claim 1, further comprising;
a chilling unit having a cooling fluid supply line and cooling fluid return line, wherein the chilling unit supplies chilled cooling fluid into the cooling fluid supply line and retrieves the cooling fluid from the cooling fluid return line, and where the cooling fluid supply line is coupled to the first liquid cooling manifold and the cooling fluid return line is coupled to the second liquid cooling manifold.

10. A cooling apparatus, comprising:
a main printed circuit (PC) board having a top side;
a plurality of connectors mounted on the top side of the main PC board in a parallel row;
a first liquid cooling manifold positioned along a first end of the parallel row of connectors; a second liquid cooling manifold positioned along a second end of the parallel row of connectors;
a plurality of heat sink devices, each having an elongated shape, running parallel to, and on each side of the plurality of connectors, the plurality of heat sink devices each having a first end and a second end wherein the first end is coupled to the first liquid cooling manifold and the second end is coupled to the second liquid cooling manifold;
at least one component assembly inserted into a first one of the plurality of connectors, wherein each component assembly comprises:
a component PC board with at least one component mounted on a front face of the component PC board;
a first heat spreader comprising a plate having a bottom side and a front face, where the front face is held against a top side of the at least one component mounted on the front face of the component PC board;
a continuous flange formed along the bottom side of the first heat spreader, such that the continuous flange contact a top side of one of the plurality of heat sink devices when the component PC board is inserted into one of the plurality of connectors.

11. A method for replacing a failed components in a computer system, comprising:
determining the location of a failed component assembly mounted in one of a plurality of connectors attached to a top side of a main PC board;
removing the failed component assembly;
inserting a replacement component assembly in place of the failed component assembly, whereby a set of tabs, formed on a bottom side of a heat spreader that is attached to the replacement component assembly, contact a top side of one of a plurality of heat sink devices running parallel to, and on either side of the plurality of connectors, when the replacement component assembly is seated into one of the plurality of connectors and where a liquid cooling system, coupled to the one of the plurality of heat sink devices, remains sealed.

12. The method of claim 11, Wherein the failed component is hot swappable and the main PC board containing the failed component remains powered up as the replacement component is inserted.

* * * * *

UNITED STATES PATENT AND TRADEMARK OFFICE
CERTIFICATE OF CORRECTION

PATENT NO.         : 8,599,557 B2
APPLICATION NO.    : 13/258521
DATED              : December 3, 2013
INVENTOR(S)        : Eric C. Peterson et al.

Page 1 of 1

It is certified that error appears in the above-identified patent and that said Letters Patent is hereby corrected as shown below:

In the Claims:

In column 4, line 23, in Claim 1, delete "tow" and insert -- row --, therefor.

In column 4, line 33, in Claim 1, delete "assenthlv comprises;" and insert -- assembly comprises: --, therefor.

In column 4, line 52, in Claim 5, delete "comprising;" and insert -- comprising: --, therefor.

In column 5, line 13, in Claim 9, delete "comprising;" and insert -- comprising: --, therefor.

In column 5, line 31, in Claim 10, delete "side of" and insert -- side of, --, therefor.

Signed and Sealed this
Twenty-fifth Day of March, 2014

Michelle K. Lee
*Deputy Director of the United States Patent and Trademark Office*